(12) United States Patent  (10) Patent No.: US 9,356,188 B2
Paranjpe et al.  (45) Date of Patent: May 31, 2016

(54) TENSILE SEPARATION OF A SEMICONDUCTING STACK

(71) Applicant: Veeco Instruments, Inc., Plainview, NY (US)

(72) Inventors: Ajit Paranjpe, Basking Ridge, NJ (US); Jia Lee, Basking Ridge, NJ (US); Craig Metzner, Simi Valley, CA (US)

(73) Assignee: Veeco Instruments, Inc., Plainview, NY (US)

( * ) Notice: Subject to any disclaimer, the term of this patent is extended or adjusted under 35 U.S.C. 154(b) by 0 days.

(21) Appl. No.: 14/480,175

(22) Filed: Sep. 8, 2014

(65) Prior Publication Data

US 2015/0069420 A1 Mar. 12, 2015

Related U.S. Application Data

(60) Provisional application No. 61/874,532, filed on Sep. 6, 2013.

(51) Int. Cl.
*H01L 33/30* (2010.01)
*H01L 33/00* (2010.01)
*H01L 33/22* (2010.01)

(52) U.S. Cl.
CPC ............. *H01L 33/0079* (2013.01); *H01L 33/22* (2013.01)

(58) Field of Classification Search
CPC . H01L 33/30; H01L 33/0075; H01L 33/0079; H01L 33/22; H01L 21/304
See application file for complete search history.

(56) References Cited

U.S. PATENT DOCUMENTS

| 8,247,261 | B2 | 8/2012 | Bedell et al. |
| 8,709,914 | B2 | 4/2014 | Bedell et al. |
| 2007/0281445 | A1 | 12/2007 | Nguyen et al. |
| 2009/0120568 | A1 | 5/2009 | Deguet et al. |
| 2013/0126890 | A1* | 5/2013 | Bedell ................. H01L 27/1218 257/76 |

FOREIGN PATENT DOCUMENTS

| JP | 2003163337 A | 6/2003 |
| KR | 1020090019990 | 3/2009 |
| KR | 1020137015922 | 6/2013 |

OTHER PUBLICATIONS

"Vertical Light-Emitting Diode Fabrication by Controlled Spalling" Stephen Bedell et al., Applied Physics Express, #6, 2013, Oct. 18, 2013, pp. 112301-1-112301-4.*

(Continued)

*Primary Examiner* — Roy Potter
*Assistant Examiner* — Paul Patton
(74) *Attorney, Agent, or Firm* — HolzerIPLaw, PC

(57) ABSTRACT

A stressor layer is applied to a semiconducting stack in order to separate the semiconducting stack at a predetermined depth. Tensile force is applied to the stressor layer, fracturing the semiconducting stack at the predetermined depth and allowing the resulting upper portion of the semiconducting stack to be used in manufacturing a semiconducting end-product (e.g., a light-emitting diode). The resulting lower portion of the semiconducting stack may be reused to grow a new semiconducting stack thereon.

24 Claims, 10 Drawing Sheets

(56) References Cited

OTHER PUBLICATIONS

Shahrjerdi, D. et al, "High-efficiency thin-film InGaP/InGaAs/Ge tandem solar cells enabled by controlled spalling technology", AIP Applied Physics Letters, http://dx.doi.org/10.1063/1.3681397, 2012, 3 pages.

Bedell, Stephen W. et al. "Vertical Light-Emitting Diode Fabrication by Controlled Spalling" Applied Physics Express 6, http://dx.doi.org/10.7567/APEX.6.112301, 2013, 4 pages.

Bedell, Stephen W. et al. "Layer transfer by controlled spalling", Journal of Physics D: Applied Physics 46, http://stacks.iop.org/JPhysD/46/152002, 2013, 6 pages.

Bedell, S.W. et al. "Cost-effective layer transfer by Controlled Spalling Technology" Abstract #2992, Honolulu PRiME 2012, The Electrochemical Society, 1 page.

International Searching Authority International Search Report and Written Opinion, Dec. 17, 2014, 11 pages.

* cited by examiner

TENSILE SEPARATION OF A SEMICONDUCTING STACK

CROSS-REFERENCE TO RELATED APPLICATIONS

The present application claims benefit of priority to U.S. Provisional Patent Application No. 61/874,532 entitled "GaN-Device Stack Lift-Off" and filed on Sep. 6, 2013, which is specifically incorporated by reference for all that it discloses or teaches.

BACKGROUND

Gallium nitride (GaN) based devices such as light-emitting diodes (LEDs) and High Electron Mobility Transistors (HEMTs) are grown on a variety of substrates including sapphire, patterned sapphire (PSS), silicon carbide (SiC), GaN and silicon. A device stack may include one or more quantum wells sandwiched between conductive layers (e.g., GaN layers) doped with impurities. The device stack may be grown on a substrate with a crystal structure similar to the crystal structure of the underlying conductive layers. In some applications, the device stack is separated from the substrate after stack growth is complete. However, known separation techniques, such as laser lift-off (LLO), can cause damage to layers of the device stack, increase current leakage, degrade long-term reliability, and reduce overall chip yield.

SUMMARY

Techniques disclosed herein allow for induced fracture and controlled lift-off of one or more layers of an LED, HEMT, or any other GaN-based opto-electronic device stack from an underlying substrate. In particular, a mechanical lift-off mechanism utilizes a spalling technique that includes application of a stressor layer to generate a stress-induced crack in the device stack, causing the device stack to fracture along a predetermined plane. Adjusting the thickness of the stressor layer and stress within the stressor layer can control the depth of the fracture. The stress in the stressor layer may be influenced by deposition conditions and the degree of doping of stressor layer material. In one implementation, the plane of fracture intersects a highly-doped conductive layer. In another implementation, the plane of fracture occurs between an interface between the device stack and the substrate. In yet another implementation, the plane of fracture intersects the substrate.

This Summary is provided to introduce an election of concepts in a simplified form that are further described below in the Detailed Description. This Summary is not intended to identify key features or essential features of the claimed subject matter, nor is it intended to be used to limit the scope of the claimed subject matter. Other features, details, utilities, and advantages of the claimed subject matter will be apparent from the following more particular written Detailed Description of various implementations and implementations as further illustrated in the accompanying drawings and defined in the appended claims.

BRIEF DESCRIPTIONS OF THE DRAWINGS

DETAILED DESCRIPTION

Figure 1:
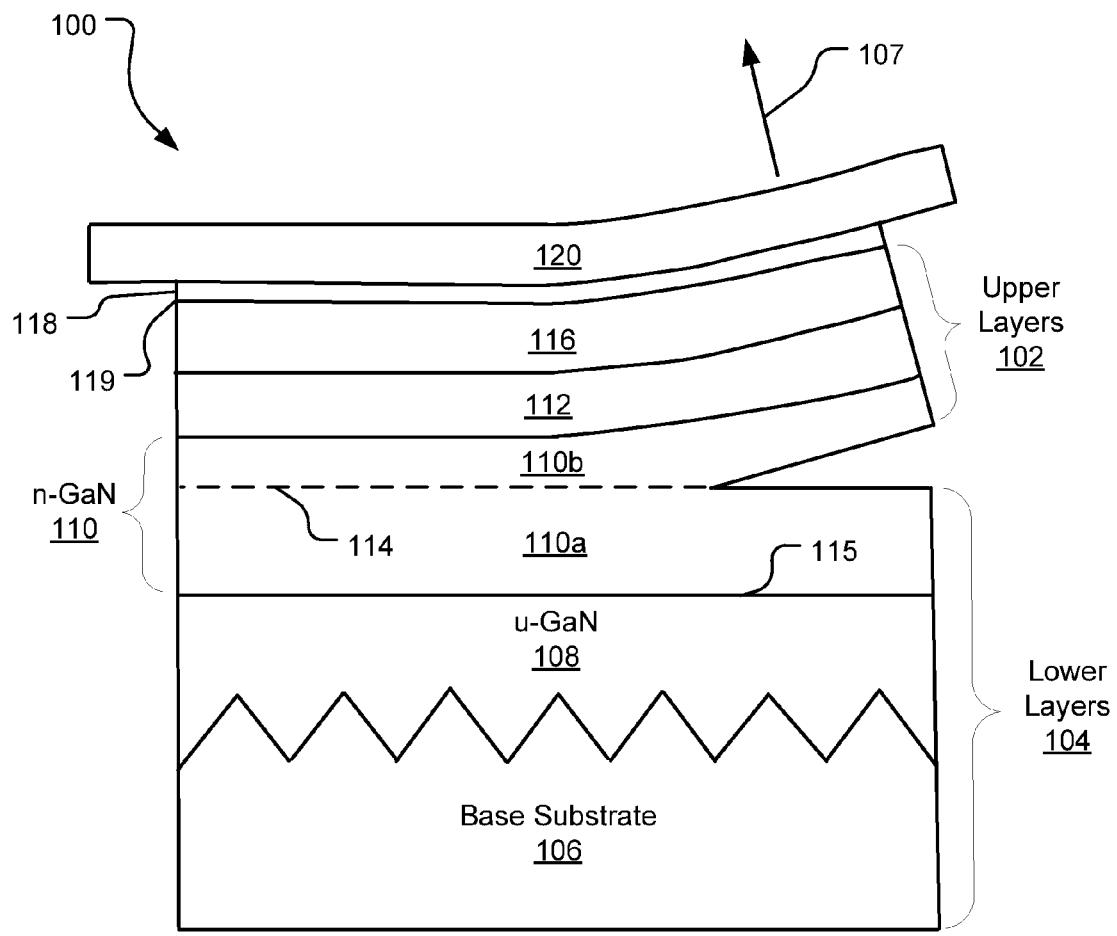
FIG. 1 illustrates an example lift-off technique for separating upper layers from lower layers of a semiconductor wafer stack.

FIG. 1 illustrates an example lift-off technique for separating upper layers 102 from lower layers 104 of a semiconductor wafer stack 100. The semiconductor wafer stack 100 includes a base substrate 106 with multiple conductive layers formed thereon. The base substrate 106 may be any type of patterned or planar semiconductor substrate, including without limitation sapphire (crystalline $Al_2O_3$), SiC, silicon, GaN, and polycrystalline aluminum nitride (AlN). In various implementations, the conductive layers formed on the base substrate 106 include one or more layers of GaN, AlN, aluminum gallium nitride (AlGaN), and/or indium gallium nitride (InGaN) arranged in an order that provides for a high quality crystal, crack-free films, and useful opto-electrical properties.

As used herein, the term "quality" refers to dislocation density within a conductive layer. A lower dislocation density is indicative of a higher quality layer. Typical dislocation density for GaN growth on sapphire is greater than approximately $10^8$ $cm^{-2}$, which arises from lattice structure and the coefficient of thermal expansion (CTE) mismatch between GaN and sapphire. For bulk GaN substrates, substantially lower dislocation densities (e.g., approximately $10^4$ $cm^{-2}$ to $10^6$ $cm^{-2}$) can be achieved based on the method of growth and the bulk GaN thickness.

Some of the implementations disclosed herein are described as including GaN layers; however, it should be understood that other conductive materials may be used in place of GaN, including without limitation AN, AlGaN, and InGaN. Further still, technology disclosed herein is primarily discussed with respect to LED stacks. However, the disclosed technology may also be used to fabricate of a variety of other GaN-based power and RF devices.

In FIG. 1, the upper layers 102 of the semi-conductor wafer stack 100 are shown forcibly separated from the lower layers 104 of the semiconductor wafer stack 100, as illustrated by arrow 107. The lower layers 104 include the base substrate 106, an un-doped GaN (u-GaN) layer 108 formed on the base substrate 106, and a lower portion 110a of a negatively doped gallium nitride (n-GaN) layer 110 formed on the u-GaN layer 108.

The lower portion 110a of the n-GaN layer 110 is severed from an upper portion 110b of the n-GaN layer 110 along a fracture path 114. In other implementations, the fracture path 114 is a different depth and/or upper layer 102 and/or lower layers 104 include additional doped or undoped layers. In at least one implementation, the lower layers 104 exclusively include the base substrate 106. In a further implementation, the fracture path 114 lies along interface 115 between the u-GaN layer 108 and the n-GaN layer 110. In a further implementation, the fracture path follows the interface between the u-GaN layer 108 and the substrate 106.

In one implementation, the upper layers 102 form part of a device stack such as an LED or HEMT stack. The upper layers 102 include an active region 112 (e.g., a multiple quantum-well (MQW)) sandwiched between the upper portion 110b of the n-GaN layer 110 and a positively doped GaN (p-GaN) layer 116. In other implementations, the upper layers 102 include additional layers not illustrated in FIG. 1. In various implementations, these additional layers may include the electrical contacts to the LED as well as superlayers on the LED such as reflectors, light extraction layers, etc.

A stressor layer 118 is formed on the p-GaN layer 116 and engineered to bend under a force to apply a tensile stress to the underlying structure at a predetermined depth. In one implementation, the stressor layer 118 is boron or phosphorous-doped nickel. The use of nickel allows for relatively low-cost deposition of thick layers via electroplating and sputtering. Stacks of high stress materials may also be used to form a composite stressor layer. Other potential stressor layer 118 materials include titanium, chromium, iron, tungsten, and their nitrides and carbides. In some implementation, an intervening adhesion-promoting layer 119 is formed between the device stack upper layer 102 and the stressor layer 118.

A liftable layer 120 is formed on the stressor layer 118 to supply a point of grip or leverage for applying the tensile stress via the stressor layer 118 to the underlying structure. The liftable layer 120 may be a handle, adhesive tape, and/or other leverage or grip-providing mechanism that adheres to the stressor layer 118. When the liftable layer 120 is peeled back or lifted upward or at an angle away from the base substrate 106 (as shown in FIG. 1) the stressor layer 118 applies the tensile stress to the underlying structure and creates the fracture line 114 between the upper portion 110b and lower portion 110a of the n-GaN layer 110 at the predetermined depth. This intentional fracturing technique used for crack propagation is also referred to herein as "spalling."

The predetermined depth of the fracture line 114 can be adjusted by varying one or both of the doping of the stressor layer 118 and the thickness of the stressor layer 118, for example. In one implementation, the thickness of the stressor layer 118 controls the depth of the fracture, while the stress in the stressor layer 118 may define the energy required to initiate and promote the crack. This energy is provided, for example, by lifting the liftable layer 120. However, if the stress of the stressor layer 118 is too high, the fracture may occur and propagate spontaneously. This spontaneous fracture propagation may create multiple fracture points and/or planes that lead to poor reproducibility and yield. In extreme cases, spalling may occur spontaneously during the stressor deposition.

In FIG. 1, the fracture line 114 intersects a single crystal plane of the n-GaN layer 110, leaving substantially smooth newly exposed surfaces of the n-GaN layer 110a, 110b. These newly exposed surface of the device stack 102 created by the spalling are referred to herein as "spalled surfaces." In one implementation, the spalled surface of the n-GaN layer 110a is a highly conductive surface on which efficient electrical connections can be formed with limited or no additional integration steps. In at least one implementation, the spalled surface is a rough surface. If the n-GaN layer 110 and/or u-GaN layer 108 are patterned or textured, for example, the pattern or texture may be replicated on the spalled surfaces.

The density of defects in the active region 112 depends on the quality of the underlying conductive layers. Thus, in some LED stack formation processes, a thick layer is grown to decrease defects in the resulting LED stack. However, growing such a thick layer can be cost-prohibitive. When the above-described spalling technique is employed, the lower layers 104 can be reused in another stack formation process with minimal or no additional surface processing. Reuse of the lower layers 104 significantly reduces the time required to produce each stack component (e.g., an LED) and also reduces associated manufacturing costs.

FIGS. 2A-2F illustrate steps in an example lateral architecture LED-manufacturing process according to the presently disclosed technology.

Figure 2A:
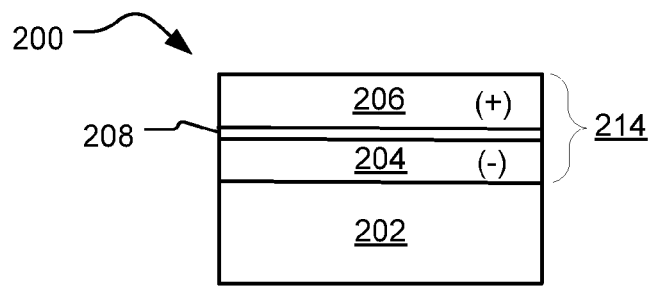
FIG. 2A illustrates an example LED stack formed on a base substrate.

FIG. 2A illustrates an example LED stack 214 formed on a base substrate 202 of a structure 200. In one implementation, depositing a negatively doped conductive layer 204 and a positively doped conductive layer 206 separated by an active region 208 (e.g., an MQW) on the base substrate 202 forms the LED stack 214. As a result, the negatively doped conductive layer 204 is adjacent to and in contact with the base substrate 202, which may include an un-doped layer (not shown, see e.g., or u-GaN layer 108 of FIG. 1.). The base substrate 202 may be a sapphire substrate or other substrate including one or more other crystalline materials including without limitation SiC, silicon, and/or GaN. In other implementations, the LED stack 214 include additional negatively doped, positively doped, and/or un-doped layers.

Figure 2B:
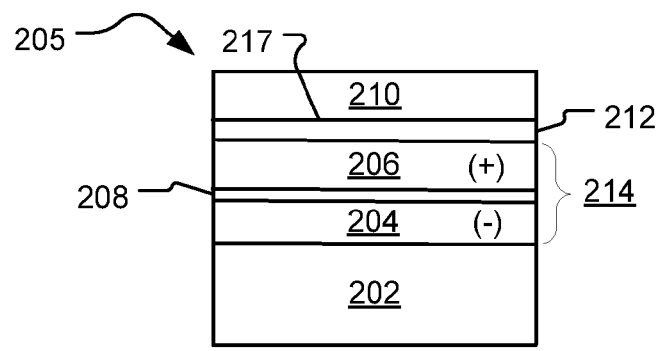
FIG. 2B illustrates an etch stop layer and a stressor layer deposited on the example LED stack of FIG. 2A.

FIG. 2B illustrates an etch stop layer 212 and a stressor layer 210 deposited on the example LED stack 214 of FIG. 2A to form structure 205. The LED stack 214 includes a negatively doped conductive layer 204 and a positively doped conductive layer 206 separated by an active region 208 deposited on a base substrate 202, which may include an un-doped layer (not shown, see e.g., or u-GaN layer 108 of FIG. 1.).

The etch stop layer 212 is deposited on top of and adjacent to the positively doped conductive layer 206. The etch stop layer 212 is a mechanically strong layer resistant to fracturing during a subsequent lift-off process (see e.g., FIG. 2C, described in detail below). The etch stop layer 212 may be removable via a wet etch (e.g., via a dilute hydrofluoric acid (HF)) or a dry etch (e.g., via a halocarbon-based etch) without damaging and with high selectivity to the positively doped conductive layer 206. A variety of materials may be suitable for the etch stop layer 212, such as silicon dioxide and silicon nitride. Such materials can be deposited at low temperatures (i.e., less than 250 degrees Celsius) via sputtering, plasma deposition, enhanced chemical vapor deposition (PE-CVD) or as a spin-on glass, for example The stressor layer 210 is formed on top of and adjacent to the etch stop layer 212. In one implementation, the stressor layer 210 is a layer of nickel, such as boron-doped or potassium-doped nickel, or one or more other high stress materials such as titanium, chromium, iron, tungsten, and their nitrides and carbides. In one implementation, a titanium or chromium adhesion layer 217 serves as the interface between the stressor layer 210 and the etch stop layer 212 to promote stronger adhesion between the layers.

The stressor layer 210 may be applied to the etch stop layer 212 through a low-temperature (e.g., room temperature) electroplating process. Because the electroplating process is low temperature, neither the substrate 202 nor the conductive layers 204, 206 are damaged. In another implementation, the stressor layer 210 is applied through a deposition process that precisely controls composition of the stressor layer during deposition. For example, specialized hardware may be utilized to statically or dynamically control and/or vary one or both of the composition of deposited material and the deposition rate of such material so as to optimize spalling for specific design criteria. The specialized hardware may also be designed to tailor the deposition thickness and the thickness profile at the edge of the structure 205. The thickness profile of the stressor layer 210 at the wafer edge controls initial crack formation and propagation, described in greater detail with respect to FIG. 2C below.

Figure 2C:
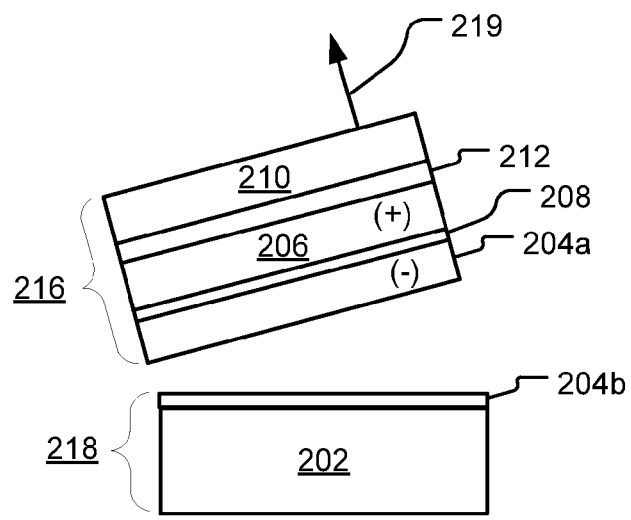
FIG. 2C illustrates an upper piece spalled from a lower piece of the structure of FIG. 2B.

FIG. 2C illustrates an upper piece 216 spalled from a lower piece 218 of the structure 205 of FIG. 2B. The upper piece 216 includes an upper portion 204a of a negatively doped conductive layer and a positively doped conductive layer 206 separated by an active region 208. The upper piece 216 further includes an etch stop layer 212 and a stressor layer 210 deposited on the positively doped conductive layer 206. The lower piece 218 includes a lower portion 204b of the negatively doped conductive layer and a base substrate 202, which may include an un-doped layer (not shown, see e.g., or u-GaN layer 108 of FIG. 1.).

The spalling technique fractures the negatively doped conductive layer, separating it into the upper portion 204a and the lower portion 204b and splitting the structure 205 into the upper piece 216 and the lower piece 218. To cause the fracture to form at a predetermined depth and across a single crystal plane, an upward force can be applied to the stressor layer 210 in a direction away from the base substrate 202 or at an angle to the base substrate 202 as illustrated by arrow 219. In one implementation, adhesive tape, a handle, or other mechanism is applied to the stressor layer 210 to transmit the upward force to the stressor layer 210 and cause the fracture.

The stressor layer 210 is specifically engineered to create the fracture in a plane of the negatively doped conductive layer. However, the depth of the fracture within the negatively doped conductive layer may be controllable by adjusting the thickness of and/or the degree of doping of the stressor layer 210. In other implementations, the stressor layer 210 may be engineered to create the fracture in another layer of the structure 205, such as in an undoped conductive layer (not shown).

In some implementations, the spalling process and/or stressor layer 210 is engineered to yield a spalled surface that is rough or textured rather than smooth. In other implementations, the edge of the structure 205 is treated prior to applying the force to the stressor layer 210 so that a cleaving crack originates at a defined point on the periphery of the structure 205 and the crack propagates until an opposite prepared edge is encountered. Treating the edge of the structure 205 in this manner can reduce yield losses due to tearing of the conductive layers at the edges that may occur if the conductive layers do not terminate abruptly at the edges. A sharp instrument, such as a cleaving tool, may be used to separate the upper piece 216 from the lower piece 218 of the structure 205.

After separation, the spalled surface of lower piece 218 may be resurfaced (e.g., polished, textured, and/or patterned). After the spalled surface of the lower piece 218 is resurfaced, it can be reused as a base for growing another stack (e.g., such as the stack 214 of FIG. 2A) on the spalled surface. In this manner, layers of a new stack can be formed on the lower portion 204b of the original negatively doped conductive layer. In various implementations, the lower portion 218 may be reused during the formation of 5 or more total stacks. In some implementations, no resurfacing of the spalled surface of lower piece 218 is necessary to reuse the lower piece 218 as a base for growing another stack. If the fracture plane propagates at the interface between the substrate 202 and the stack 214, a thermal bake of the substrate 202 at temperatures of 1050° C.-1350° C. in a hydrogen or chlorine containing environment may be sufficient to etch off any residual GaN from the wafer surface and make it ready for reuse.

The above-described spalling process may result in improved light output as compared to LEDs manufactured using prior art laser lift-off (LLO) separation techniques. The improved light output is attributable, in part, to the gradient-like doping structure inherent in some LEDs. Conductive layers formed proximal to the base substrate 202 may have decreased doping as compared to layers formed further away from the base substrate 202. Thus, when prior art LLO is used to separate a stack from a base substrate, the resulting separation is along a boundary between the un-doped conductive layer and the base substrate. However, when the resulting separation is within the negatively doped conductive layer 204 (as described above) the spalled surface exhibits greater electrical conductivity than the surface area that is exposed using prior art LLO techniques. This greater electrical conductivity is conducive to implementation of an integration scheme that can improve light output (measured in Lumens or Watts) in the resulting LED. Further, some prior art LLO techniques entail time-consuming additional processing steps that are eliminated via the above-discussed spalling technique. For example, prior art LLO may entail etching of the undoped conductive layer 204 to avoid a decrease in light output.

Figure 2D:
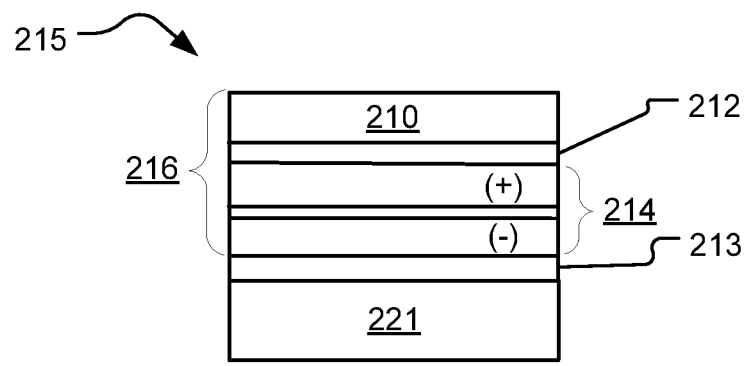
FIG. 2D illustrates the upper piece of FIG. 2C attached to a permanent substrate.

FIG. 2D illustrates the upper piece 216 of FIG. 2C attached to a permanent substrate 221 to form structure 215. The upper piece 216 includes an LED stack 214, an etch stop layer 212, and a stressor layer 210.

A reflective layer 213 is deposited on the spalled surface of the upper portion 216. The permanent substrate 221 is then attached to the reflective layer 213. The addition of the reflective layer 213 and/or texturing of the spalled surface can lead to improved light extraction as compared to conventional LEDs including PSS. In one implementation, the spalled surface of the upper portion 216 is specifically textured to reflect emitted light toward the top surface of the LED stack 214 with a small angle of incidence (i.e., the angle between an incoming ray of light and direction normal to the planar layer surfaces). Light rays with small angles of incidence exit the LED stack 214 and contribute to useful light output. In at least one implementation, the reflective layer 213 is made of silver.

The reflective layer 213 may bonded to the permanent substrate 221 using one of a variety of suitable bonding processes such as room-temperature epoxy bonding, low temperature soldering, eutectic bonding, or other attachment processes. In one implementation, a low temperature solder such as gold-tin (AuSn) is used to form a bond between the permanent substrate 221 and the reflective layer 213. Use of AuSn limits the maximum soldering temperature to less than 250 degrees Celsius and avoids damage to the reflective layer 213.

The permanent substrate 221 is made of a material that exhibits improved reliability, light output, and thermal conductivity as compared to the base substrate 202 of FIGS. 2A-2C. Suitable materials for the permanent substrate 221 include without limitation silicon, AlN, and composite laminate substrates. In one implementation, the permanent substrate 221 is transparent.

Figure 2E:
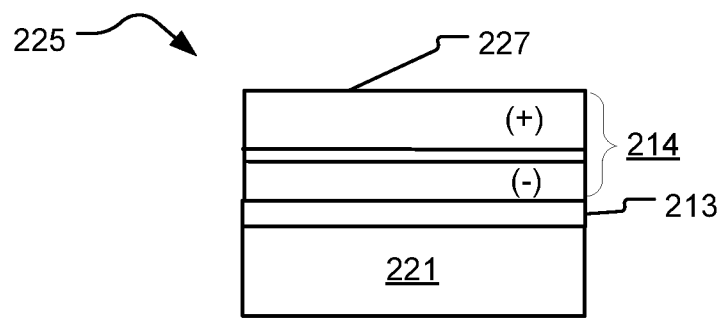
FIG. 2E illustrates a structure with the stressor layer removed from the structure of FIG. 2D.

FIG. 2E illustrates a structure 225 with the stressor layer 210 removed from the structure 215 of FIG. 2D. The structure 225 includes LED stack 214 mounted on a permanent substrate 221 with a reflective layer 213 there between. In one implementation, the stressor layer 210 is removed from the LED stack 214 via a chemical etching process, which may be either wet or dry. An underlying etch stop layer (see etch stop layer 212 of FIG. 2D) allows for removal of substantially all of the material of the stressor layer 210. The etch stop layer 212 is subsequently removed by a wet etch or dry etch that does not damage the LED stack 214. In one implementation, one or more transparent coatings 227 (e.g., layers of transparent conductive oxide) are deposited on the exposed surface of the LED stack 214 to provide for improved current distribution leading to increased light output from the LED stack 214.

Figure 2F:
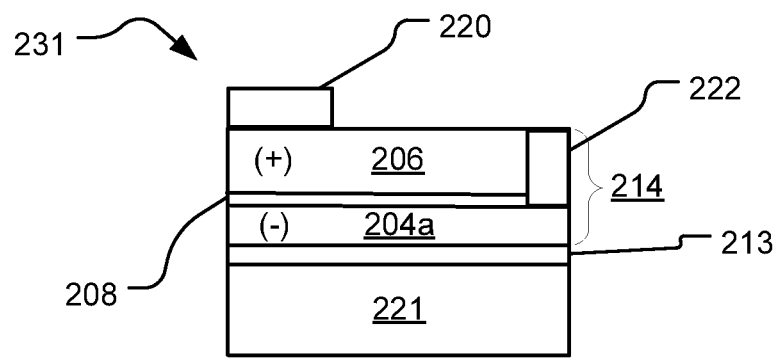
FIG. 2F illustrates the structure of FIG. 2E with example contacts to form a completed LED with a lateral architecture.

FIG. 2F illustrates the structure 225 of FIG. 2E with example contacts 220, 222 to form a first example completed LED 231 with a lateral architecture. The LED 231 includes LED stack 214 mounted on a permanent substrate 221 with a reflective layer 213 there between. The LED stack 214 includes a negatively doped conductive layer 204a and a positively doped conductive layer 206 separated by an active region 208.

A first electrically conductive contact 220 formed on top of and adjacent to the positively-doped conductive layer 206 to provide a first electrical connection to the underlying layers of the LED 231. A second electrically conductive contact 222 is formed in a cavity etched through a portion of the positively-doped conductive layer 206 and the active region 208. The electrical contacts 220, 222 provide a lateral current path through the LED stack 214 of the LED 231.

Figure 2G:
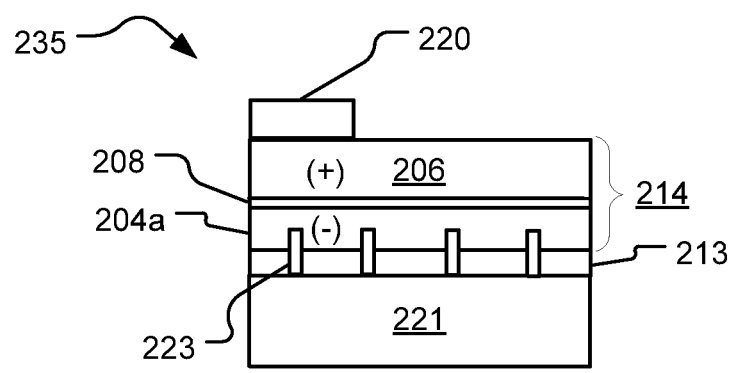
FIG. 2G illustrates the structure of FIG. 2E with example contacts to form a second example completed LED with a lateral architecture.

FIG. 2G illustrates the structure 225 of FIG. 2E with example contacts 220, 221 to form a second example completed LED 235 with a lateral architecture. The LED 235 includes LED stack 214 mounted on a permanent substrate 221 with a reflective layer 213 there between. The LED stack 214 includes a negatively doped conductive layer 204a and a positively doped conductive layer 206 separated by an active region 208.

A first electrically conductive contact 220 is formed on top of and adjacent to the positively-doped conductive layer 206 to provide a first electrical connection to the underlying layers of the LED 235. The permanent substrate 221 acts as the second electrically conductive contact. In some implementations, the material utilized for the reflective layer 213 is sufficiently conductive for the permanent substrate 221 (or a solder pad on the permanent substrate 221) to be used as the second electrically conductive contact without further integration of the LED 235. In such case, current flows along a path from the permanent substrate 221 through the reflective layer 213 and the LED stack 214 to the first electrical contact 220.

If the material utilized for the reflective layer 213 is not sufficiently conductive, one or more etching processes may be performed to etch vias (e.g., via 223) through the reflective layer 213 and into the negatively doped conductive layer 204a. These vias may be filled with a conductive material, such as aluminum or copper, to provide a current path between the negatively doped conductive layer 204a and the permanent substrate 221, allowing current to flow from the substrate 221, through the LED stack 214, and to the first electrical contact 220.

The implementation of FIG. 2G may yield increased light extraction as compared to the implementation of FIG. 2F because the placement of the second electrical connection may reduce the light emission area by 2%-5% depending on the chip size and the dimensions of the electrical connection. The electrical contacts 220, 221 may take the form of rectangular pads on the structure 225 surface with a lateral extent of about 70-100 microns. When prior art LLO separation techniques are employed, it is not feasible to place the substrate 221 in conductive contact with the negatively doped conductive layer 204a, as illustrated in FIGS. 2F and 2G.

FIGS. 3A-3G illustrate steps in an example vertical architecture LED-manufacturing process according to the presently disclosed technology.

Figure 3A:
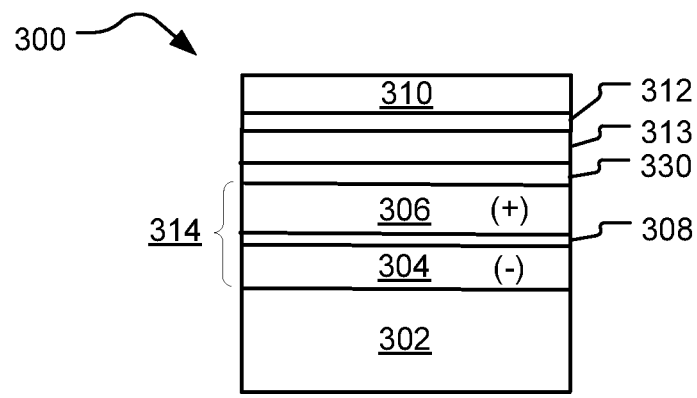
FIG. 3A illustrates an etch stop layer and a stressor layer deposited on the example LED stack of FIG. 2A.

FIG. 3A illustrates an etch stop layer and a stressor layer deposited on the example LED stack 214 of FIG. 2A to form structure 300. LED stack 314 includes a negatively doped conductive layer 304 and a positively doped conductive layer 306 separated by an active region 308 deposited on a base substrate 302, which may include an un-doped layer (not shown, see e.g., or u-GaN layer 108 of FIG. 1.).

An electrically conductive contact layer 330 is deposited on top of and in contact with the positively doped conductive layer 306. A reflective layer 313 is deposited on top of and adjacent to the electrically conductive layer 330. An etch stop layer 312 is deposited on top of and in contact with the reflector layer 313. A stressor layer 310 is thereafter formed on top of and adjacent to the etch stop layer 312. The structure 300 may be formed from a variety of materials and using a variety of processes, including those discussed above with respect to FIGS. 1-2.

Figure 3B:
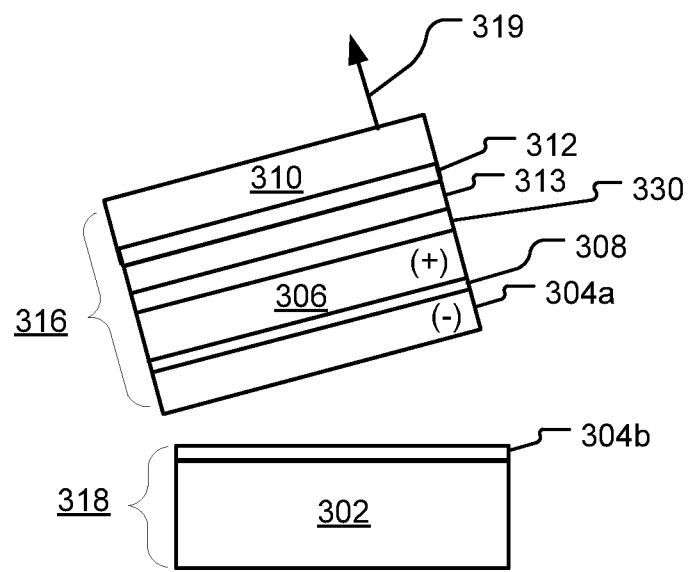
FIG. 3B illustrates an upper piece spalled from a lower piece of the structure of FIG. 3A.

FIG. 3B illustrates an upper piece 316 spalled from a lower piece 318 of the structure 300 of FIG. 3A. The upper piece 316 includes an upper portion 304a of a negatively doped conductive layer and a positively doped conductive layer 306 separated by an active region 308. The upper piece 316 further includes an electrically conductive contact layer 330, a reflective layer 313, an etch stop layer 312, and a stressor layer 310 deposited on the positively doped conductive layer 306. The lower piece 318 includes a lower portion 304b of the negatively doped conductive layer and a base substrate 302, which may include an un-doped layer (not shown, see e.g., or u-GaN layer 108 of FIG. 1.).

The negatively-doped conductive layer fractures along a line separating the upper portion 304a from the lower portion 304b, splitting the structure 300 of FIG. 3A into the upper piece 316 and the lower piece 318. To cause the fracture to form at a predetermined depth and across a single crystal plane, an upward force is applied to the stressor layer 310 in a direction away from the base substrate 302 or at an angle to the base substrate 302, as illustrated by arrow 319. The depth of the fracture is controllable by adjusting the thickness of and/or the degree of doping of the stressor layer 310. In the implementation of FIG. 3B, the stressor layer 310 is engineered to create the fracture in a plane of the negatively doped conductive layer. In other implementations, the stressor layer 310 is engineered to create the fracture in another layer of the structure 300 (e.g., along the interface of the u-GaN layer with the substrate 302.

After separation, the spalled surface of lower piece 318 may be resurfaced (e.g., polished, textured, patterned, and/or baked). After the spalled surface of the lower piece 318 is resurfaced, it can be reused as a base for growing another stack (e.g., such as the stack 214 of FIG. 2A) on the spalled surface. In this manner, layers of a new stack can be formed on the lower portion 304b of the original negatively doped conductive layer. In some implementations, baking rather than resurfacing of the spalled surface of lower piece 318 is sufficient to reuse the lower piece 318 as a base for growing another stack.

Figure 3C:
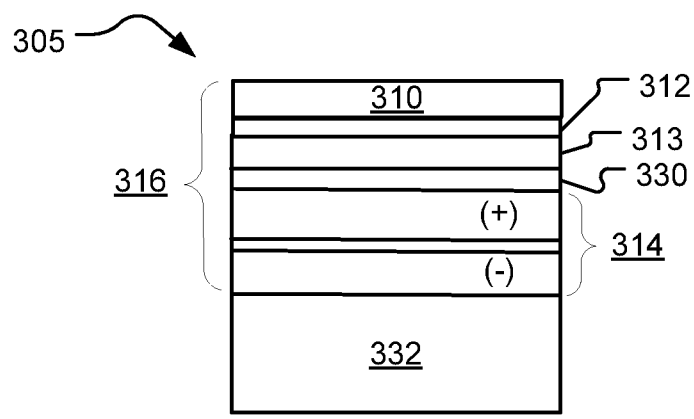
FIG. 3C illustrates the upper piece of FIG. 3B bonded to a temporary carrier.

FIG. 3C illustrates the upper piece 316 of FIG. 3B bonded to a temporary carrier 332 to form structure 305. The upper piece 316 includes an electrically conductive contact layer 330, a reflective layer 313, an etch stop layer 312, and a stressor layer 310 deposited on an LED stack 314. The temporary carrier 332 provides for a crack-free transfer of the structure 305 from one physical location to another physical location. In various implementations, the temporary carrier 332 includes silicon, quartz, and/or glass. Further, various removable adhesives may be used to bond the temporary carrier 332 to the LED stack 314.

Figure 3D:
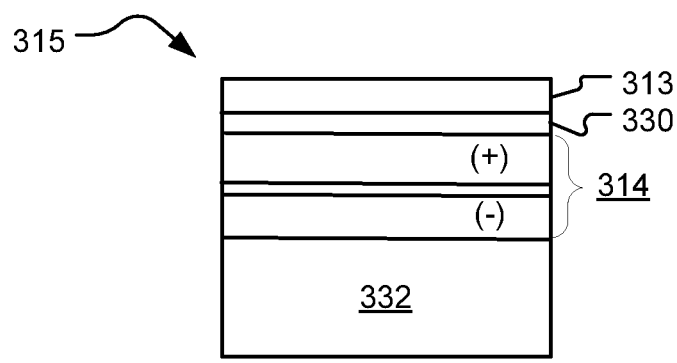
FIG. 3D illustrates a structure with the stressor layer removed from the structure of FIG. 3C.

FIG. 3D illustrates a structure 315 with the stressor layer 310 removed from the structure 305 of FIG. 3C. The structure 315 includes LED stack 314 mounted on a temporary carrier 332. An electrically conductive contact layer 330 and a reflective layer 313 are deposited on the LED stack 314. In one implementation, the stressor layer 310 is removed from the LED stack 314 via a chemical etching process. An underlying etch stop layer (see etch stop layer 312 of FIG. 3C) allows for removal of substantially all of the material of the stressor layer 310.

Another process option is to deposit the reflective layer 313 after the etch stop layer 312 is removed, especially if the etch is damaging to the reflector layer 313 or if the adhesion between the reflective layer 313 and the conductive contact layer 330 is not adequate to withstand the forces applied during the spalling process.

Figure 3E:
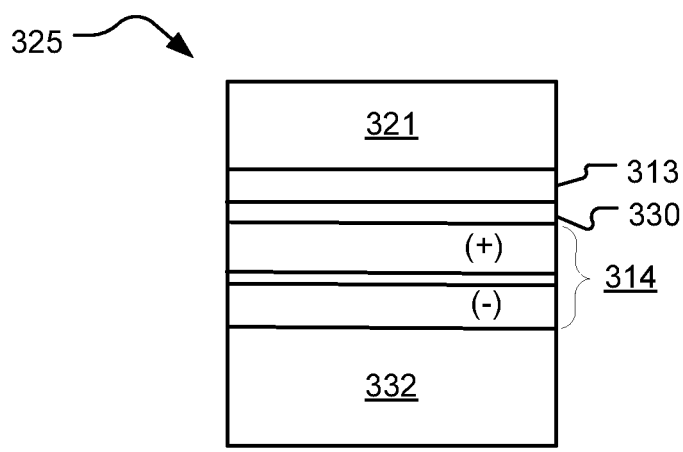
FIG. 3E illustrates a permanent substrate bonded to the structure of FIG. 3D.

FIG. 3E illustrates a permanent substrate 321 bonded to the structure 315 of FIG. 3D to form structure 325. The structure 325 includes LED stack 314 mounted on a temporary carrier 332. An electrically conductive contact layer 330 and a reflective layer 313 are deposited on the LED stack 314. The permanent substrate 321 is bonded to the reflective layer 313. Bonding of the permanent substrate 321 to the reflective layer 313 may be performed using a variety of techniques including without limitation epoxy bonding, low temperature soldering, eutectic bonding, etc.

Figure 3F:
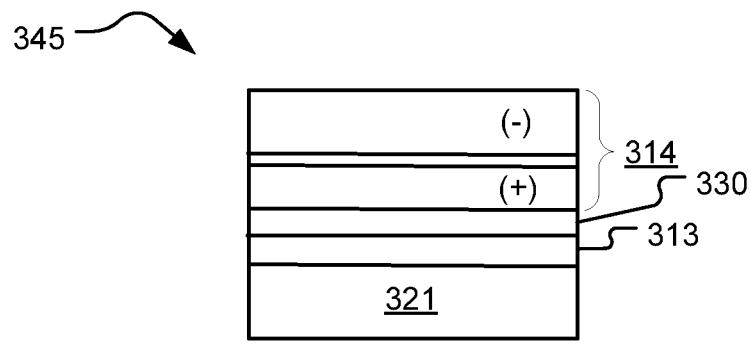
FIG. 3F illustrates a temporary carrier removed from the structure of FIG. 3E.

FIG. 3F illustrates a temporary carrier 332 removed from the structure 325 of FIG. 3E to form structure 345. The structure 345 includes an LED stack 314, an electrically conductive contact layer 330, and a reflective layer 313. A permanent substrate 321 is bonded to the reflective layer 313.

A de-bonding process separates the temporary carrier 332 from the structure 345. A variety of de-bonding techniques may be effective in weakening the adhesive force of the material bonding the temporary carrier 332 to the structure 345. Suitable de-bonding techniques include, for example, heating, chemical treatment, and UV exposure. Residual bonding material can be chemically removed from the temporary carrier 332 so that the temporary carrier 332 can be reused.

Figure 3G:
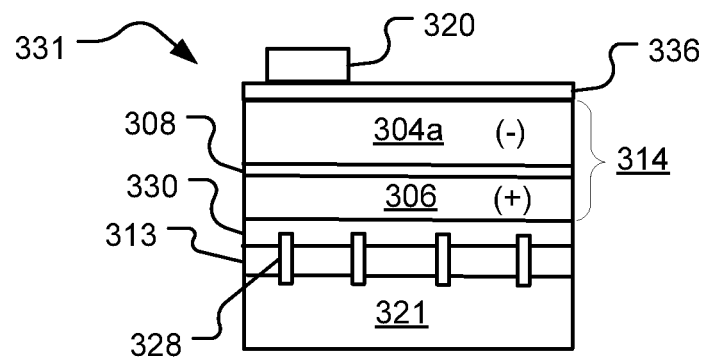
FIG. 3G illustrates the structure of FIG. 3F with example contacts to form an example completed LED with a vertical architecture.

FIG. 3G illustrates the structure 345 of FIG. 3F with example contacts 320, 321 to form an example completed LED 331 with a vertical architecture. The LED 331 includes an LED stack 314, an electrically conductive contact layer 330, and a reflective layer 313. A permanent substrate 321 is bonded to the reflective layer 313. The LED stack 314 includes a negatively doped conductive layer 304a and a positively doped conductive layer 306 separated by an active region 308.

The LED 331 further includes a transparent conductive oxide layer 336 deposited on the LED stack 314 to provide for increased light output. At least one other implementation does not include the transparent conductive oxide layer 336. In one implementation, the LED stack 314 is textured prior to deposition of the transparent conductive layer 336 to further increase light output.

The first metal contact 320 is formed on top of the transparent conductive oxide layer 336 and the permanent substrate 321 acts as the second electrical contact. If the material utilized for the reflective layer 313 is sufficiently conductive, the permanent substrate 321 may be used as a second electrical contact without further integration. However, if the reflective layer 313 is not sufficiently conductive, one or more etching processes may be performed to etch vias (e.g., a via 328) through the reflector layer 313 and into the electrically conductive layer 330. The vias are filled with conductive material to provide a current path between the LED stack 314 and the permanent substrate 321.

The vertical architecture LED 331 is depicted "n-side up", meaning that the negatively-doped conductive layer 304a is proximal to the top of the LED stack 314. This allows for light emission through the negatively doped conductive layer 304a. Because the negatively doped conducive layer 304a is relatively thick and has a higher electrical conductivity than the positively doped conductive layer 306, this configuration may reduce or eliminate the need for current-spreading metals and oxides that improve current spreading.

The vertical architecture of LED 331 does not entail etching into or through any of the positively doped conductive layer 306, the negatively doped conductive layer 304a, or the active region 308. As a result, the vertical architecture LED may allow for improved current spreading, reduced energy loss to thermal emissions, and higher light extraction efficiency as compared to one or more LED stacks having a lateral architecture, as shown in FIGS. 2F and 2G.

In other implementations, an LED stack produced via the spalling techniques disclosed herein may have a vertical structure that has a "p-side up", meaning that the positively doped conductive layer 306 is proximal to the top (e.g., the light-emitting side) of the LED stack 314. Because the positively-doped conductive layer 306 may be naturally rough, this can improve total light output of the LED.

FIGS. 4A-4D illustrate steps in another example vertical architecture LED-manufacturing process according to the presently disclosed technology.

Figure 4A:
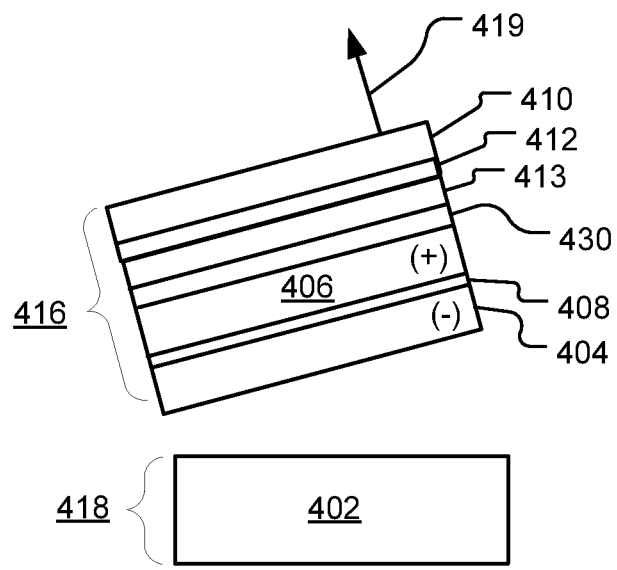
FIG. 4A illustrates an upper piece spalled from a lower piece of the structure of FIG. 3A.

FIG. 4A illustrates an upper piece 416 spalled from a lower piece 418 of the structure 300 of FIG. 3A. The upper piece 416 includes a negatively doped conductive layer 404 and a positively doped conductive layer 406 separated by an active region 408. The upper piece 416 further includes an electrically conductive contact layer 430, a reflective layer 413, an adhesion layer 412, and a stressor layer 410 deposited on the positively doped conductive layer 406. The lower piece 418 includes a base substrate 402, which may include an un-doped layer (not shown, see e.g., or u-GaN layer 108 of FIG. 1.).

The fracture separating the upper piece 416 from the lower piece 418 occurs at the layer boundary between LED stack 414 and the base substrate 402. This is distinct from the fracture illustrated in FIGS. 2C and 3B, which split the negatively doped conductive layer 404 in two pieces. To cause the fracture to form at the layer boundary and across a single crystal plane, an upward force is applied to the stressor layer 410 in a direction away from the base substrate 402 or at an angle to the base substrate 402, as illustrated by arrow 419. The depth of the fracture is controllable by adjusting the thickness of and/or the degree of doping of the stressor layer 410. In other implementations, the stressor layer 410 is engineered to create the fracture elsewhere within the structure 300 of FIG. 3A.

After separation, the spalled surface of lower piece 418 may be resurfaced (e.g., polished, textured, and/or patterned). After the spalled surface of the lower piece 418 is resurfaced, it can be reused as a base for growing another stack (e.g., such as the stack 214 of FIG. 2A) on the spalled surface. In this manner, layers of a new stack can be formed on the base substrate 402. In some implementations, baking rather than resurfacing of the spalled surface of lower piece 418 is sufficient to reuse the lower piece 418 as a base for growing another stack.

Figure 4B:
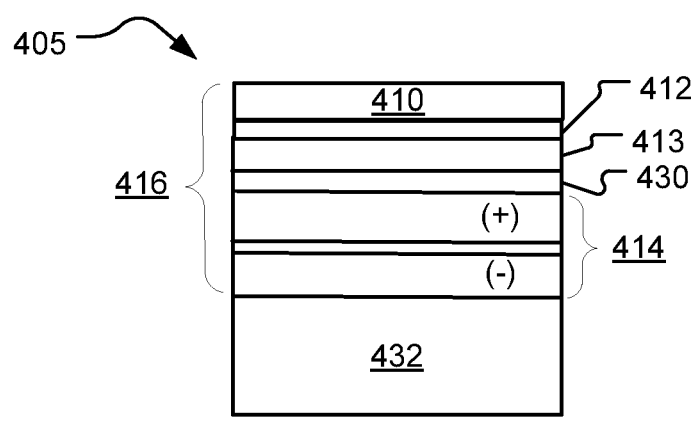
FIG. 4B illustrates the upper piece of FIG. 4A bonded to a temporary carrier.

FIG. 4B illustrates the upper piece 416 of FIG. 4A bonded to a temporary carrier 432 to form structure 405. The upper piece 416 includes an electrically conductive contact layer 430, a reflective layer 413, an adhesion layer 412, and a stressor layer 410 deposited on an LED stack 414. The temporary carrier 432 provides for a crack-free transfer of the structure 405 from one physical location to another physical location.

Figure 4C:
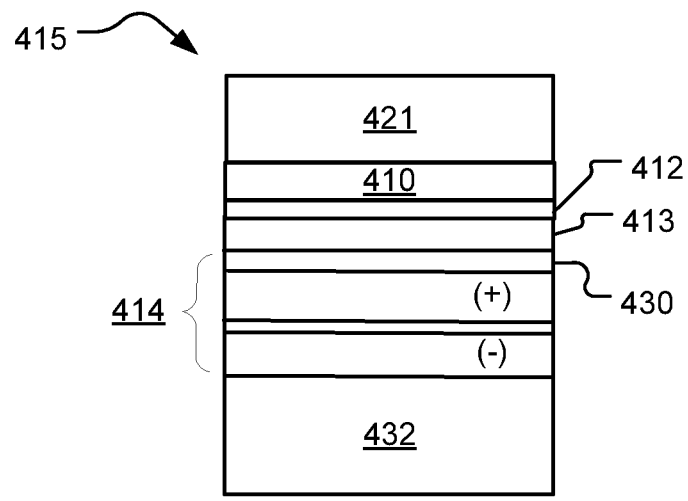
FIG. 4C illustrates a permanent substrate bonded to the structure of FIG. 4B.

FIG. 4C illustrates a permanent substrate 421 bonded to the structure 405 of FIG. 4B to form structure 415. The structure 415 includes LED stack 414 mounted on a temporary carrier 432. An electrically conductive contact layer 430 and a reflective layer 413 are deposited on the LED stack 414. A stressor layer 410 is bonded to the reflective layer 413 via an adhesion layer 412. The permanent substrate 421 is bonded to the stressor layer 410. The implementation of FIG. 4C is distinct from the implementations of FIGS. 2D and 3E at least in that the stressor layer 410 is not removed from the structure 415 and instead forms a permanent part of the structure 415 as the permanent substrate 421 is bonded to the stressor layer 410.

Figure 4D:
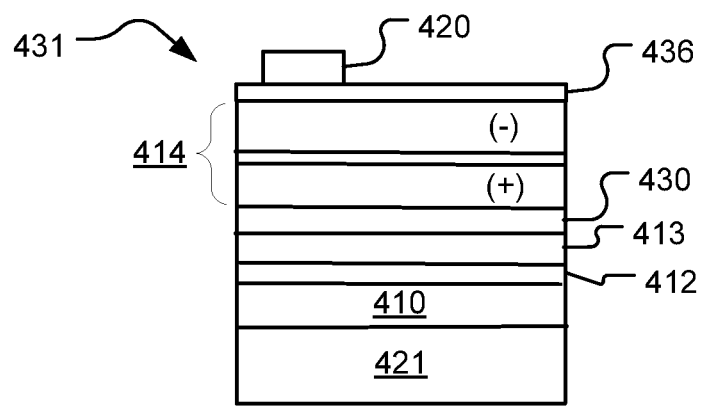
FIG. 4D illustrates the structure of FIG. 4C with the temporary carrier removed and example contacts to form an example completed LED with a vertical architecture.

FIG. 4D illustrates the structure 415 of FIG. 4C with the temporary carrier 432 removed and example contacts 420, 421 to form an example completed LED 431 with a vertical architecture. The LED 431 includes an LED stack 414, an electrically conductive contact layer 430, a reflective layer 413, an adhesion layer 412, a stressor layer 410, and a permanent substrate 421.

The LED 431 further includes a transparent conductive oxide layer 436 deposited on the LED stack 414 to provide for increased light output. At least one other implementation does not include the transparent conductive oxide layer 436. In one implementation, the LED stack 414 is textured prior to deposition of the transparent conductive layer 436 to further increase light output.

The first metal contact 420 is formed on top of the transparent conductive layer 436 and the permanent substrate 421 acts as the second electrical contact. In some implementations, the transparent conductive layer 436 is omitted. If the materials utilized for the reflective layer 413, the adhesion layer 412, and the stressor layer 410 are sufficiently conductive, the permanent substrate 421 may be used as a second electrical contact without further integration. However, if any of the reflective layer 413, the adhesion layer 412, and the stressor layer 410 are not sufficiently conductive, one or more etching processes may be performed to etch vias (not shown, see e.g., via 328 of FIG. 3G). The vias are filled with conductive material to provide a current path between the LED stack 414 and the permanent substrate 421.

The stressor layer 410 causes lattice strain in the conductive layers of the LED 431 and acts to reduce the built-in polarization-induced electrical field within the active region of the LED 431. Built-in electric fields cause separation between electrons and holes in the active region. Therefore, this reduction in the built-in field can increase the overlap between the electrons and holes in the active region, which increases the probability of radiative recombination between the electrons and holes, thereby increasing the overall brightness (Lumens/Watt) of the LED 431.

Figure 5:
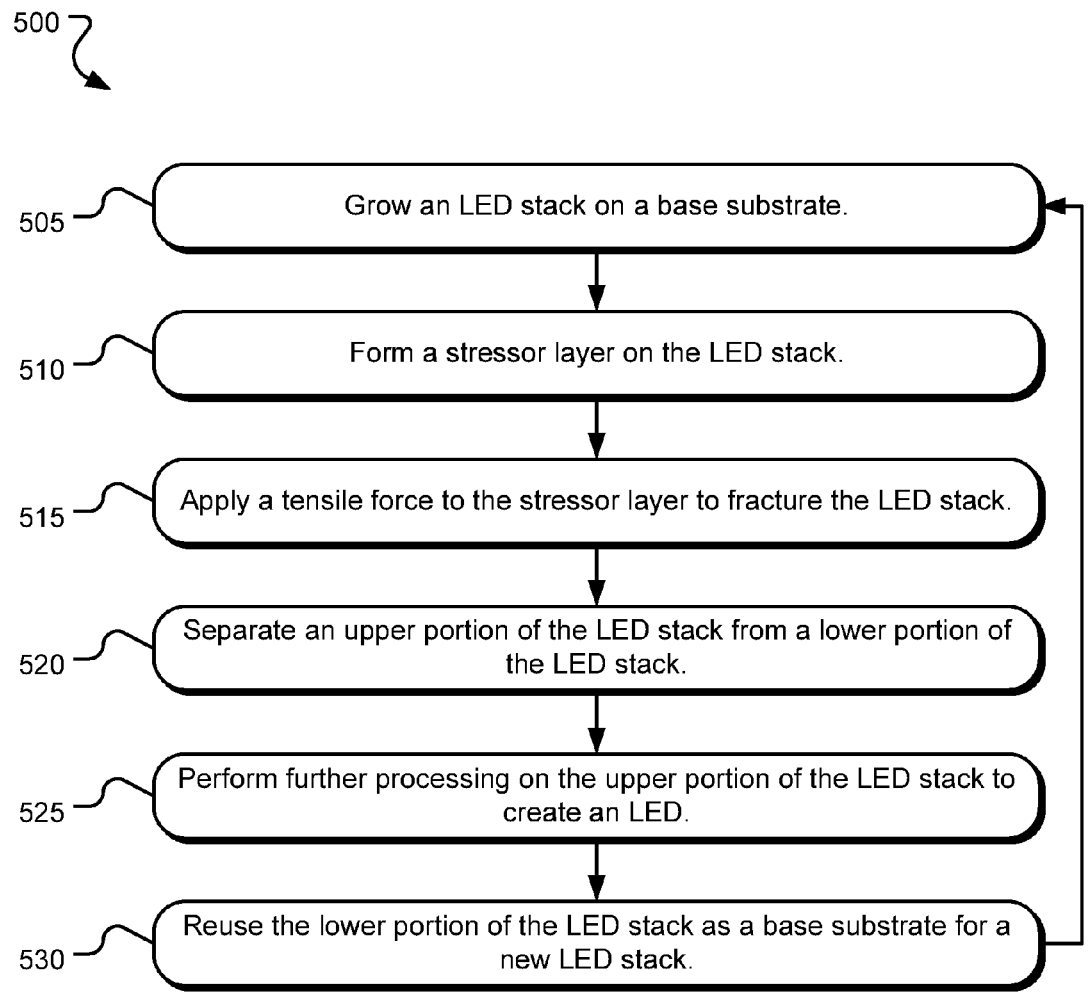
FIG. 5 illustrates example operations for spalling an upper portion from a lower portion of a semiconductor wafer stack.

FIG. 5 illustrates example operations 500 for spalling an upper portion from a lower portion of a semiconductor wafer stack. A growing operation 505 grows an LED stack on a base substrate. In various implementations, the LED stack includes an active region and at least two conductive layers. A forming operation 510 forms a stressor layer on the LED stack. The thickness and doping of the stressor layer are carefully selected to achieve a predetermined fracture depth in applying operation 515 below.

The applying operation 515 applies a tensile force to the stressor layer to fracture the LED stack at the predetermined depth. A separation operation 520 separates an upper portion of the LED stack from a lower portion of the LED stack. A performing operation 525 performs further processing on the upper portion of the LED stack to create an LED. A reusing operation 530 reuses the lower portion of the LED stack as a base substrate for growing a new LED stack, as set forth in growing operation 505.

The specific steps discussed with respect to each of the implementations disclosed herein are a matter of choice and may depend on the materials utilized and/or design criteria of a given system. Since many implementations of the invention can be made without departing from the spirit and scope of the invention, the invention resides in the claims hereinafter appended.

What is claimed is:

1. A method of forming a light-emitting diode (LED), the method comprising:
    forming a stressor layer on a layered stack, the layered stack including an active region, at least two conductive layers, and a base substrate, wherein the at least two conductive layers are formed on the base substrate and a pattern is included within the base substrate;
    applying a force to the stressor layer to a fracture at a predetermined depth in the layered stack; and
    separating an upper portion of the layered stack from a lower portion of the layered stack, the upper portion and the lower portion being divided by the fracture, wherein the pattern is preserved on a surface exposed by the fracture.

2. The method of claim 1, wherein the at least two conductive layers are separated by the active region and include a layer of negatively-doped gallium nitride and a layer of positively-doped gallium nitride.

3. The method of claim 2, wherein the fracture separates the layer of negatively-doped gallium nitride into an upper negatively-doped gallium nitride portion and a lower negatively-doped gallium nitride portion.

4. The method of claim 1, wherein the fracture is formed along an interface between a gallium nitride layer and the base substrate.

5. The method of claim 2, wherein the fracture separates the layer of negatively-doped gallium nitride from a layer of un-doped gallium nitride grown on the base substrate.

6. The method of claim 1, further comprising:
    depositing an additional active region and at least two additional conductive layers on the lower portion of the layered stack after the upper portion of the layered stack is separated from the lower portion of the layered stack.

7. The method of claim 6, further comprising:
resurfacing a spalled surface of the lower portion of the layered stack prior to depositing the additional active region and the at least two additional conductive layers.

8. The method of claim 1, further comprising:
forming an etch stop layer between the stressor layer and the at least two conductive layers.

9. The method of claim 1, further comprising:
bonding the upper portion of the layered stack to a permanent substrate, wherein the permanent substrate is more thermally conductive than the base substrate.

10. The method of claim 1, wherein the upper portion of the layered stack is configured to flow electricity between a first electrical contact adjacent to a conductive layer and a permanent substrate.

11. The method of claim 1, further comprising:
etching to remove substantially all of the stressor layer from the upper portion of the layered stack.

12. The method of claim 1, wherein the stressor layer is retained in the LED.

13. A light-emitting diode (LED) comprising:
an LED stack including an active region and at least two conductive layers, wherein a spalled surface of one of the conductive layers is bonded to a permanent substrate that is more thermally conductive than a base substrate on which the LED stack is originally formed.

14. The LED of claim 13, further comprising:
one or more electrical contacts that permit the conduction of electricity through the LED.

15. The LED of claim 13, wherein the LED has vertical architecture or a horizontal architecture.

16. A method of forming a light-emitting diode (LED), the method comprising:
forming a stressor layer on a layered stack, wherein the layered stack includes an active region, at least two conductive layers, and a base substrate;
applying a force to the stressor layer to create a fracture at a predetermined depth in the layered stack; and
separating an upper portion of the layered stack from a lower portion of the layered stack, the upper portion and the lower portion being divided by the fracture; and
bonding the upper portion of the layered stack to a permanent substrate, wherein the permanent substrate is more thermally conductive than the base substrate.

17. The method of claim 16, wherein the fracture separates a layer of negatively-doped gallium nitride into an upper negatively-doped gallium nitride portion and a lower negatively-doped gallium nitride portion.

18. The method of claim 16, wherein the fracture is formed along an interface between a gallium nitride layer and the base substrate.

19. The method of claim 16, wherein the fracture further separates a layer of negatively-doped gallium nitride from a layer of un-doped gallium nitride grown on the base substrate.

20. The method of claim 16, wherein a pattern is included within the base substrate or within one of the conductive layers and the pattern is preserved on a surface exposed by the fracture.

21. The method of claim 16, further comprising:
depositing an additional active region and at least two additional conductive layers on the lower portion of the layered stack after the upper portion of the layered stack is separated from the lower portion of the layered stack.

22. The method of claim 16, further comprising:
forming an etch stop layer between the stressor layer and the at least two conductive layers.

23. The method of claim 16, further comprising:
etching to remove substantially all of the stressor layer from the LED stack.

24. A method of forming a light-emitting diode (LED), the method comprising:
forming a stressor layer on a layered stack, wherein the layered stack includes an active region and at least two conductive layers formed on a substrate;
applying a force to the stressor layer to create a fracture at a predetermined depth in the layered stack;
separating an upper portion of the layered stack from a lower portion of the layered stack, the upper portion and the lower portion being divided by the fracture; and
depositing an additional active region and at least two additional conductive layers on the lower portion of the layered stack after the upper portion of the layered stack is separated from the lower portion of the layered stack.

\* \* \* \* \*